(12) United States Patent
Suekawa et al.

(10) Patent No.: US 9,842,906 B2
(45) Date of Patent: Dec. 12, 2017

(54) SEMICONDUCTOR DEVICE

(71) Applicant: MITSUBISHI ELECTRIC CORPORATION, Tokyo (JP)

(72) Inventors: Eisuke Suekawa, Tokyo (JP); Yasunori Oritsuki, Tokyo (JP); Yoichiro Tarui, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 40 days.

(21) Appl. No.: 14/702,212

(22) Filed: May 1, 2015

(65) Prior Publication Data

US 2015/0243753 A1   Aug. 27, 2015

Related U.S. Application Data

(63) Continuation of application No. 13/299,882, filed on Nov. 18, 2011, now Pat. No. 9,041,007.

(30) Foreign Application Priority Data

Nov. 25, 2010 (JP) ................................ 2010-262120
Oct. 24, 2011 (JP) ................................ 2011-232666

(51) Int. Cl.
*H01L 29/49* (2006.01)
*H01L 29/45* (2006.01)
(Continued)

(52) U.S. Cl.
CPC .......... *H01L 29/4941* (2013.01); *H01L 29/45* (2013.01); *H01L 29/456* (2013.01);
(Continued)

(58) Field of Classification Search
None
See application file for complete search history.

(56) References Cited

U.S. PATENT DOCUMENTS 5,209,816 A   5/1993   Yu et al.
7,632,759 B2  12/2009  Hoeglauer et al.
(Continued)

FOREIGN PATENT DOCUMENTS

CN   1864270   11/2006
CN   1969389   5/2007
(Continued)

OTHER PUBLICATIONS

Satoshi Tanimoto, et al., "Mechanism of Interlayer Dielectric Penetration Caused by Al Interconnect and Preventive Measures", ECS Transactions, vol. 6, No. 2, 2007, pp. 213-219.*
(Continued)

*Primary Examiner* — Fazli Erdem
*Assistant Examiner* — Scott R Wilson
(74) *Attorney, Agent, or Firm* — Oblon, McClelland, Maier & Neustadt, L.L.P.

(57) ABSTRACT

A MOSFET cell of a semiconductor device includes a polysilicon gate electrode and an $n^+$-source region formed in an upper portion of an $n^-$-drift layer. An interlayer insulating film covers the gate electrode. An Al source electrode extends on the interlayer insulating film. An Al gate pad is connected to the gate electrode. A barrier metal layer that prevents diffusion of aluminum is interposed between the source electrode and the interlayer insulating film, and between the gate pad and the gate electrode.

14 Claims, 13 Drawing Sheets

(51) Int. Cl.
*H01L 29/78* (2006.01)
*H01L 29/861* (2006.01)
*H01L 29/16* (2006.01)

(52) U.S. Cl.
CPC .......... *H01L 29/78* (2013.01); *H01L 29/7802* (2013.01); *H01L 29/7804* (2013.01); *H01L 29/7815* (2013.01); *H01L 29/861* (2013.01); *H01L 29/1608* (2013.01)

(56) References Cited

U.S. PATENT DOCUMENTS

| | | | |
|---|---|---|---|
| 7,829,416 B2 | 11/2010 | Kudou et al. | |
| 8,546,814 B2 | 10/2013 | Nakano et al. | |
| 8,901,571 B2 | 12/2014 | Nakano et al. | |
| 2005/0167742 A1* | 8/2005 | Challa | H01L 21/3065 257/328 |
| 2006/0071257 A1* | 4/2006 | Kang | G11C 7/04 257/295 |
| 2006/0289928 A1 | 12/2006 | Takaya et al. | |
| 2007/0120194 A1* | 5/2007 | Shiraishi | H01L 29/1095 257/368 |
| 2008/0128743 A1 | 6/2008 | Letavic et al. | |
| 2009/0078966 A1* | 3/2009 | Asai | H01L 29/66462 257/194 |
| 2009/0114982 A1 | 5/2009 | Saka et al. | |
| 2010/0075474 A1 | 3/2010 | Kudou et al. | |
| 2010/0084706 A1 | 4/2010 | Kocon | |
| 2010/0193799 A1 | 8/2010 | Nakano et al. | |
| 2010/0270586 A1 | 10/2010 | Ueno | |
| 2011/0297964 A1 | 12/2011 | Miura | |
| 2012/0012861 A1* | 1/2012 | Nakano | H01L 29/1095 257/77 |
| 2012/0049187 A1* | 3/2012 | Haruyama | H01L 29/866 257/49 |
| 2014/0054611 A1 | 2/2014 | Nakano et al. | |

FOREIGN PATENT DOCUMENTS

| | | |
|---|---|---|
| CN | 101548387 A | 9/2009 |
| DE | 43 17 544 | 5/1993 |
| JP | 3-3270 A | 1/1991 |
| JP | 04-158516 | 6/1992 |
| JP | 6-244287 A | 9/1994 |
| JP | 2000-216249 | 8/2000 |
| JP | 2001-237159 A | 8/2001 |
| JP | 2003-68759 A | 3/2003 |
| JP | 2005-057049 | 3/2005 |
| JP | 2005-322781 | 11/2005 |
| JP | 2009-176884 | 8/2009 |
| JP | 2009-177102 | 8/2009 |
| JP | 2009-194127 | 8/2009 |
| JP | 4365894 | 11/2009 |
| JP | 2010-129707 | 6/2010 |
| JP | 2010-244977 | 10/2010 |
| JP | 2010-258328 A | 11/2010 |
| KR | 10-0215338 | 8/1999 |
| KR | 10-0526452 | 11/2007 |
| WO | WO 2010/110246 A1 | 9/2010 |

OTHER PUBLICATIONS

Communication from Patent Opposition dated Oct. 22, 2015 in Japanese Patent Application No. 2011-232666 with partial English translation.
C. O'Dwyer, et al. "State-of-the-Art Program on Compound Semiconductors 46 (SOTAPOCS 46)—and—Processes at the Semiconductor/Solution Interface 2", Demandant's Exhibit No. 1: ECS Transactions, vol. 6, No. 2, 2007, pp. 213-219 and covers pages.
Office Action dated Sep. 5, 2013 in Korean Patent Application No. 10-2013-0089423 (with English-language translation).
Office Action dated Mar. 28, 2013 in Korean Patent Application No. 10-2011-0118734 (with English-language translation).
Office Action dated Sep. 4, 2014 in Chinese Patent Application No. 201110380365.8 (with partial English-language translation).
Office Action dated Aug. 6, 2014 in German Patent Application No. 10 2011 086 943.3 (with partial English-language translation).
Office Action dated Sep. 16, 2014 in Japanese Patent Application No. 2011-232666 (with English-language translation).
Office Action dated Apr. 10, 2014 in Korean Patent Application No. 10-2013-0089423 (with English-language translation).
Office Action dated Jan. 14, 2014 in German Patent Application No. 10 2011 086 943.3.
Office Action dated Jan. 6, 2014 in Chinese Patent Application No. 201110380365.8.
Korean Office Action dated Apr. 19, 2016 in Patent Application No. 10-2014-0086563 (with Partial English Translation).
Japanese Office Action dated May 10, 2016 in Patent Application No. 2015-020205 (with partial English translation).
Satoshi Tanimoto, et al., "Mechanism of Interlayer Dielectric Penetration Caused by Al Interconnect and Preventive Measures", ECS Transactions, vol. 6, No. 2, 2007, pp. 213-219 and cover page.
U.S. Appl. No. 13/189,873, filed Jul. 25, 2011, Suekawa, et al.
Office Action dated May 11, 2015 in Chinese Patent Application No. 201110380365.8 (with English language translation).
Office Action for Japanese Patent Application No. 2015-700038 dated Jan. 12, 2017, with partial English translation.
Decision of Refusal dated Mar. 7, 2017 for counterpart Application No. JP 2015-020205 (w/partial translation).
Office Action dated Feb. 22, 2017 for Chinese counterpart application, No. 201410216921.1, and Partial English Translation thereof.
Combined Office Action and Search Report dated May 24, 2016 in Chinese Patent Application No. 201410216921.1 with partial English translation.

* cited by examiner

F I G. 5
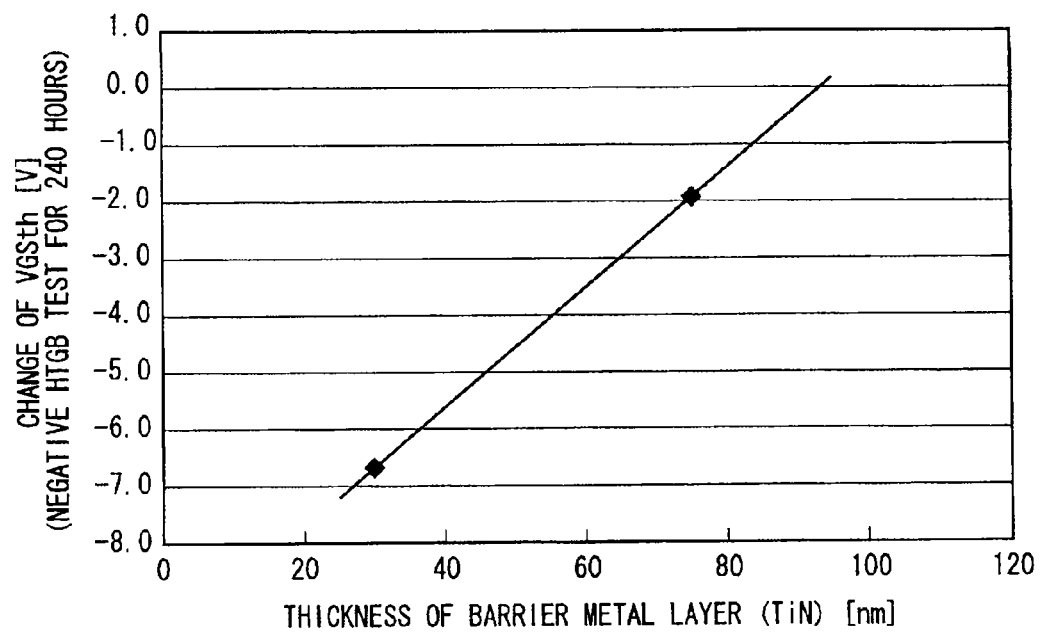

F I G . 1 1
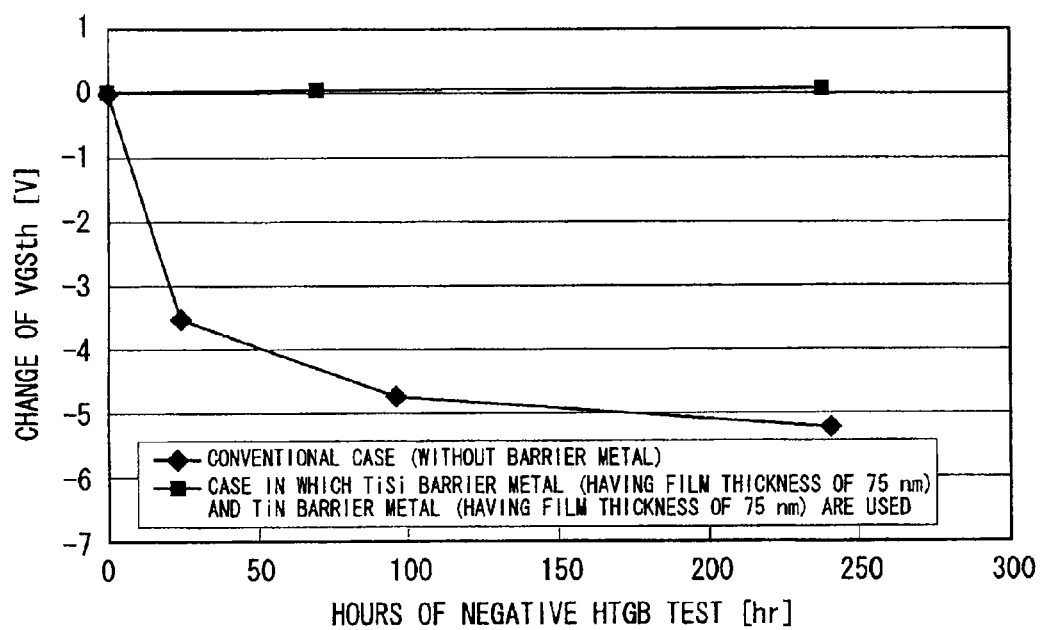

SEMICONDUCTOR DEVICE

CROSS-REFERENCE TO RELATED APPLICATIONS

This application is a continuation of and claims the benefit of priority under 35 U.S.C. §120 for U.S. Ser. No. 13/299,882 filed Nov. 18, 2011, and claims the benefit of priority under 35 U.S.C. §119 from Japanese Patent Application Nos. 2010-262120 filed Nov. 25, 2010 and 2011-232666 filed Oct. 24, 2011. The entire contents of each of the above are incorporated herein by reference.

BACKGROUND OF THE INVENTION

Field of the Invention

The present invention relates to a semiconductor device, and more specifically to a semiconductor device with a transistor cell with a polysilicon gate electrode and an interconnect line containing aluminum.

Description of the Background Art

Semiconductor elements (MOSFETs (metal oxide semiconductor field effect transistors), IGBTs (insulated gate bipolar transistors) and others) formed by using silicon carbide (SiC) are promising candidates for next-generation switching elements capable of achieving high breakdown voltage, low loss, and high resistance to heat, and are expected to be applied to power semiconductor devices such as inverters.

A generally employed structure of a conventional MOSFET using SiC (SiC-MOSFET) is such that a silicide layer to make ohmic contact is formed on a source region, and a source electrode made of aluminum (Al) is formed on the silicide layer (see for example Japanese Patent Application Laid-Open No. 2009-194127). In the structure disclosed in Japanese Patent Application Laid-Open No. 2009-194127, a metal layer made of Ti is interposed between a silicide layer on a source region and an aluminum source electrode, and the metal layer functions as a barrier metal to suppress diffusion of Al.

A reliability test such as an HTGB (high temperature gate bias) test conducted by continuously applying a voltage between the gate and the source shows that the conventional SiC-MOSFET suffers from reduction with time in a gate-to-source threshold voltage (VGSth).

Reduction in the threshold voltage increases the transfer characteristics (ratio of output to input) of the MOSFET to generate flow of overcurrent during the actual use of the MOSFET, resulting in a fear of breakage of the MOSFET. Reduction in the threshold voltage also increases a switching speed during turn on. This generates nonuniformity of the operations of a plurality of MOSFET cells of a semiconductor chip, resulting in a fear of breakage of the semiconductor chip. Further, even if no problem in electric characteristics is found as a result of the test, the threshold voltage may be reduced due to prolonged application of voltage stress between the gate and the source, so the aforementioned problem is likely to occur.

SiC devices achieve excellent electric characteristics at high temperatures, so they are expected to be used in a high-temperature condition. Meanwhile, Al forming a source electrode may cause corrosion of an interlayer insulating film intended to maintain the isolation between the gate and the source, or may diffuse into polysilicon forming a gate interconnect line that is what is called "Al spike," resulting in a fear of formation of a short circuit between the gate and the source.

SUMMARY OF THE INVENTION

It is an object of the present invention to provide a semiconductor device capable of suppressing reduction with time in a threshold voltage, preventing corrosion of an insulating film to be generated by an aluminum interconnect line, and preventing a short circuit to be generated between a gate and a source by Al spike.

The semiconductor device of the present invention includes: a main transistor cell with a polysilicon gate electrode formed on a semiconductor layer, and a source region that is an impurity region formed in an upper portion of the semiconductor layer; and an interlayer insulating film covering the gate electrode. A source electrode which contains aluminum and is connected to the source region extends on the interlayer insulating film. A gate pad containing aluminum is connected to the gate electrode. A barrier metal layer that prevents diffusion of aluminum is interposed between the source electrode and the interlayer insulating film, and between the gate pad and the gate electrode.

The barrier metal layer that prevents diffusion of aluminum is interposed between the source electrode and the interlayer insulating film, and between the gate pad and the gate electrode. This prevents reduction in a threshold voltage to be generated by voltage stress applied to the gate electrode of the transistor, thereby enhancing the stability of a MOSFET. Further, the interlayer insulating film is not corroded by Al contained in the source electrode and the gate pad, and Al spike is not generated in the polysilicon gate electrode even in a high-temperature condition, thereby preventing generation of a short circuit between the gate and the source.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows a relationship between the thickness of a TiN barrier metal layer and the change of the threshold voltage of the MOSFET;

FIG. 11 shows a relationship between time of a negative HTGB test and the change of a threshold voltage of a MOSFET;

EMBODIMENTS FOR CARRYING OUT THE INVENTION

First Preferred Embodiment

Figure 1:
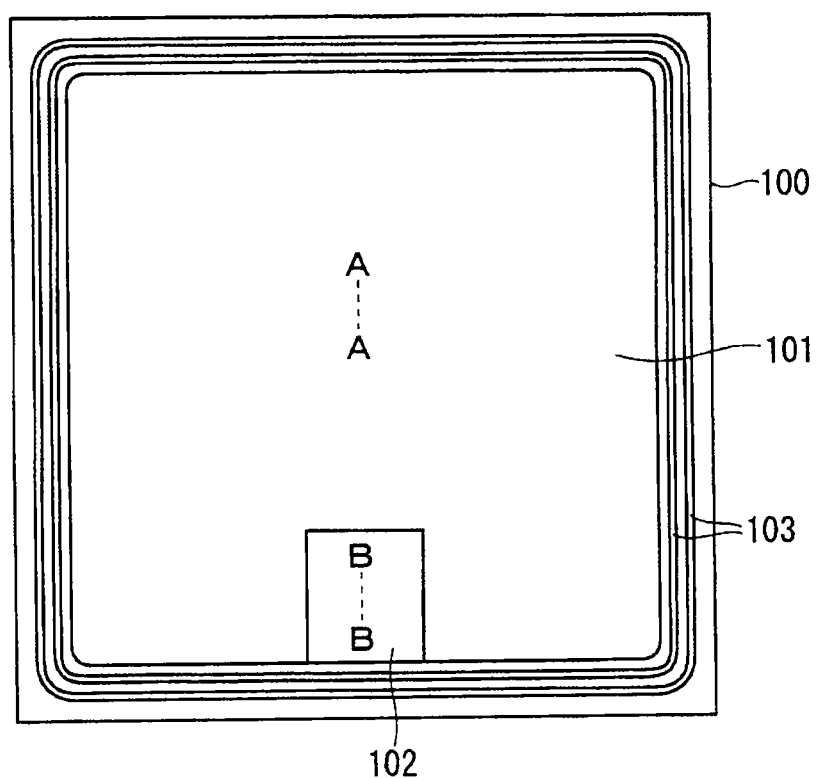
FIG. 1 is a top view of a semiconductor chip with a semiconductor device of a first preferred embodiment.

FIG. 1 is a top view of a semiconductor chip with a semiconductor device of a first preferred embodiment of the present invention. An SiC-MOSFET is shown as an example of the semiconductor device. A source electrode 101 and a gate pad 102 connected to a gate electrode are formed on the upper surface of a MOSFET chip 100 to hold the MOSFET. A field limiting ring 103 is provided as a termination structure on the outer circumference of the MOSFET chip 100.

Figure 2A:
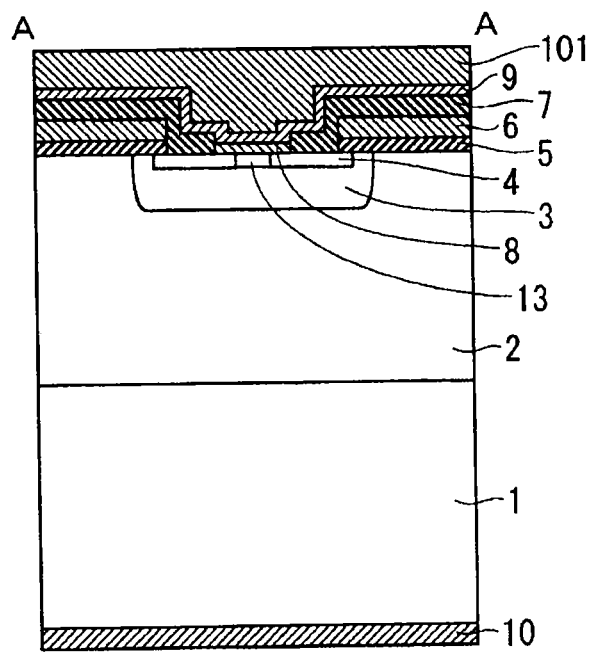
FIGS. 2A and 2B respectively are sectional views of a MOSFET cell portion and a gate pad region of the semiconductor chip of the first preferred embodiment.
Figure 2B:
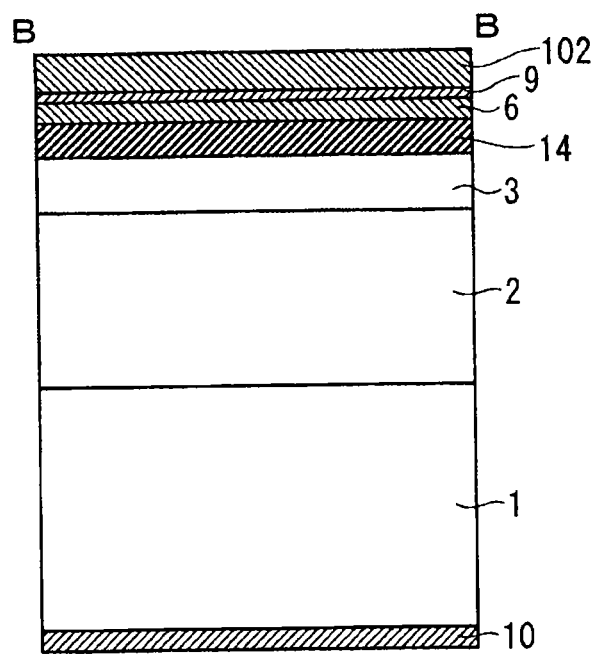

FIGS. 2A and 2B are sectional views of the MOSFET chip 100. FIG. 2A is a sectional view of a MOSFET cell portion (cross section taken along a line A-A of FIG. 1). FIG. 2B is a sectional view of a gate pad portion (cross section taken along a line B-B of FIG. 1). The MOSFET chip 100 includes parallel connection of a plurality of cells of the structure shown in FIG. 2A, and the gate electrode of each of the cells is connected to the gate pad 102.

The MOSFET includes an SiC substrate to become an $n^+$-buffer layer 1, and an epitaxial substrate with an epitaxial growth layer to become an $n^-$-drift layer 2. As shown in FIGS. 2A and 2B, a p-base region 3 is formed in an upper portion of the $n^-$-drift layer 2, and an $n^+$-source region 4 and a $p^+$-contact layer 13 are formed in a surface portion of the p-base region 3. A gate insulating film 5 which is constructed of a thermally oxidized film and covers the $n^+$-source region 4, the p-base region 3, and part of the $n^-$-drift layer 2 adjoining the p-base region 3 is formed in the upper surface of the epitaxial growth layer. A polysilicon gate electrode 6 is formed on the gate insulating film 5.

An interlayer insulating film 7 made for example of TEOS (tetraethyl orthosilicate) is formed on the gate electrode 6. To be specific, the interlayer insulating film 7 is removed on part of the $n^+$-source region 4 and part of the p-base region 3 (parts on which the gate electrode 6 is not formed). A silicide layer 8 (compound layer of SiC and metal such as nickel silicide (NiSi)) in ohmic contact with the $n^+$-source region 4 and the $p^+$-contact layer 13 in the p-base region 3 is formed in these parts. A barrier metal layer 9 to suppress diffusion of aluminum (Al) is formed on the interlayer insulating film 7 and the silicide layer 8. A source electrode 101 made of Al or an Al alloy (such as AlSi) is formed on the barrier metal layer 9. The barrier metal layer 9 is made of titanium (Ti) or titanium nitride (TiN). A drain electrode 10 is formed on the lower surface of the $n^+$-buffer layer 1.

As shown in FIG. 2B, a field oxide film 14 is formed on an upper surface of the epitaxial growth layer, and the gate electrode 6 extends over the field oxide film 14. The interlayer insulating film 7 is removed in the gate pad portion to expose the gate electrode 6. The barrier metal layer 9 is formed on the exposed upper surface of the gate electrode 6, and an Al gate pad 102 is formed on the barrier metal layer 9. The source electrode 101 and the gate pad 102 are formed in the same process. To be specific, the source electrode 101 and the gate pad 102 are electrically isolated from each other after being patterned together with the barrier metal layer 9.

Figure 3:
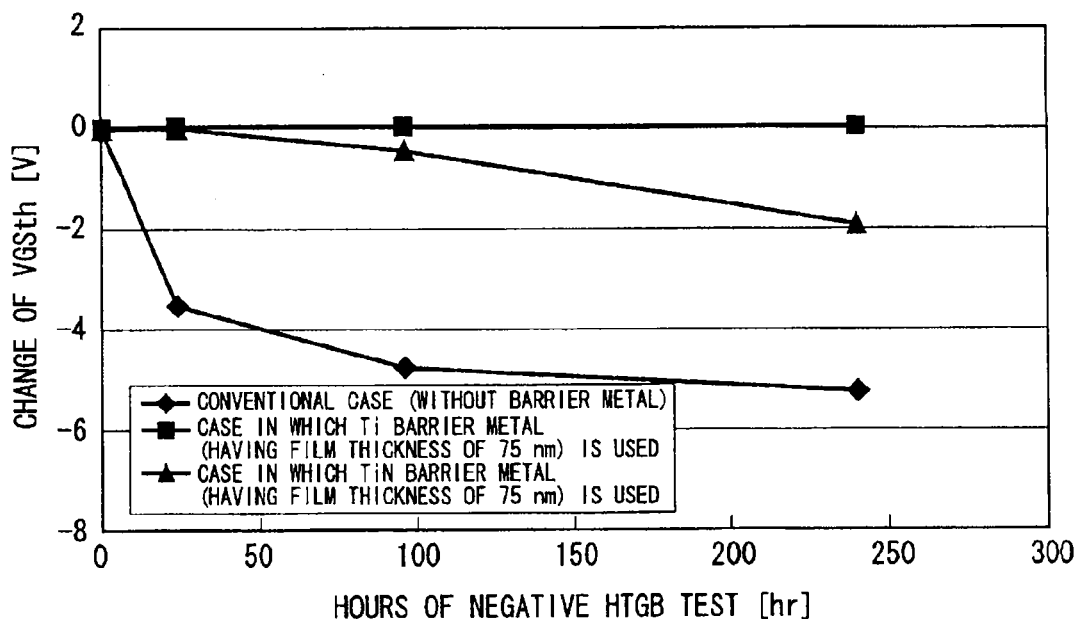
FIG. 3 shows a relationship between time of a negative HTGB test and the change of a threshold voltage of a MOSFET.

FIG. 3 is a graph showing a relationship between time of an HTGB test conducted by applying a negative voltage to the gate of the MOSFET (negative HTGB test), and the change of a gate-to-source threshold voltage (VGSth) (change from an initial threshold voltage). This graph includes a result obtained in a conventional structure with no barrier metal layer 9, a result obtained in a structure with the barrier metal layer 9 made of Ti, and a result obtained in a structure with the barrier metal layer 9 made of TiN. TiN can be formed by depositing Ti to have a desired thickness and then performing lamp annealing at 800° for about 30 seconds under a nitrogen ($N_2$) atmosphere. The method of forming TiN used in the embodiments below may be similar to the above as well. For example, in a case of forming TiN having a thickness of 75 nm, Ti is deposited to have a thickness of 75 nm and then is subjected to lamp annealing as described above. The barrier metal layer 9 used in the test has a thickness of 75 nm. The HTGB test was conducted with a gate-to-source voltage set at −20 V, and with an ambient temperature set at 125° C.

As shown in FIG. 3, the conventional MOSFET experienced reduction in a threshold voltage of about 5 V from its initial value in the HTGB test conducted for 240 hours. The MOSFET with the TiN barrier metal layer 9 experienced lower reduction in a threshold voltage of about 2 V. The MOSFET with the Ti barrier metal layer 9 experienced substantially no reduction in a threshold voltage. This shows that the MOSFET of the present invention suppresses reduction with time in a threshold voltage, so that the operation of the MOSFET of the present invention is given enhanced stability.

In the semiconductor device of the first preferred embodiment, the barrier metal layer 9 to suppress diffusion of Al is interposed between the interlayer insulating film 7 and the source electrode 101 in the MOSFET cell portion, and between the gate electrode 6 and the gate pad 102 in the gate pad portion. This prevents corrosion of the interlayer insulating film 7 to be generated by Al contained in the source electrode 101, and Al spike to be generated in the polysilicon gate electrode 6 even in a high-temperature condition, thereby preventing a short circuit between the gate and the source. Al spike in the gate electrode 6 in the gate pad portion to be generated by Al contained in the gate pad 102 is also prevented. Al spike in the gate electrode 6, if generated especially at a temperature of 300° C. or higher, comes through the gate electrode 6 to reach the gate insulating film 5. This may result in a problem of lower reliability of breakdown voltage of the gate insulating film 5, and this problem is avoided by the first preferred embodiment.

Figure 4:
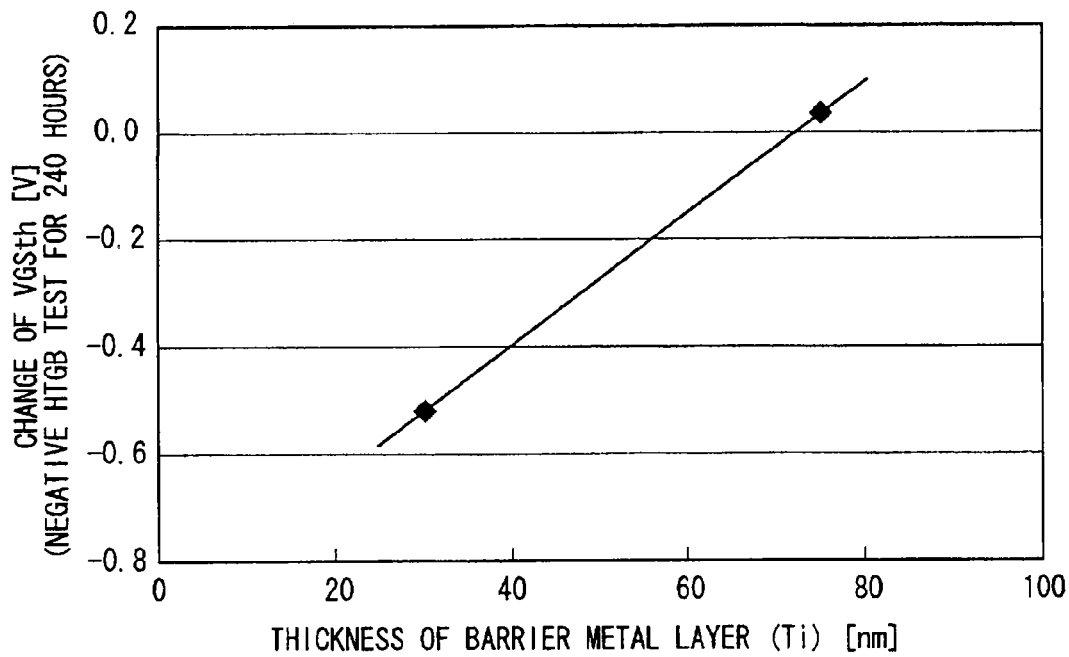
FIG. 4 shows a relationship between the thickness of a Ti barrier metal layer and the change of the threshold voltage of the MOSFET.

FIG. 4 shows a relationship between the thickness of the Ti barrier metal layer 9 and the change of the threshold voltage (VGSth) of the MOSFET. The relationship is obtained as a result of an HTGB test conducted for 240 hours that is the same test as that conducted to obtain the results shown in FIG. 3. Here, the HTGB test was conducted on a MOSFET with the barrier metal layer 9 having a thickness of 30 nm, and on a MOSFET with the barrier metal layer 9 having a thickness of 75 nm.

As also shown in FIG. 3, the threshold voltage did not reduce after the HTGB test conducted for 240 hours when the Ti barrier metal layer 9 had a thickness of 75 nm. In contrast, the threshold voltage reduced by about 0.5 V when the Ti barrier metal layer 9 had a thickness of 30 nm. Reduction in the threshold voltage is suppressed more effectively with the greater thickness of the barrier metal layer 9. The thickness of the barrier metal layer 9 of 60 nm or more is especially effective as it can limit reduction of a threshold voltage to about 0.2 V or less.

FIG. 5 shows a relationship between the thickness of the TiN barrier metal layer 9 and the change of the threshold voltage (VGSth) of the MOSFET. The relationship is obtained as a result of an HTGB test conducted for 240 hours that is the same test as that conducted to obtain the results shown in FIG. 3. Here, the HTGB test was conducted on a MOSFET with the barrier metal layer 9 having a thickness of 30 nm, and on a MOSFET with the barrier metal layer 9 having a thickness of 75 nm.

As also shown in FIG. 3, the threshold voltage reduced by about 2 V after the HTGB test conducted for 240 hours when the TiN barrier metal layer 9 had a thickness of 75 nm. In contrast, the threshold voltage reduced by about 6.6 V when the TiN barrier metal layer 9 had a thickness of 30 nm. In a case where the barrier metal layer 9 is made of TiN, the thickness of the barrier metal layer 9 of 90 nm or more is effective as it can limit reduction of the threshold voltage to about 0.2 V or less.

Second Preferred Embodiment

Some MOSFETs include a current sensing cell that detects current flowing in the MOSFETs. An exemplary object of the current sensing cell is to detect overcurrent so that the MOSFETs can be protected from breakage due to overcurrent. The current sensing cell generally shares a gate and a drain with a MOSFET cell normally used (main MOSFET cell). The current sensing cell diverts part of main current flowing in a MOSFET to obtain minute current that is in proportion to the main current.

Figure 6:
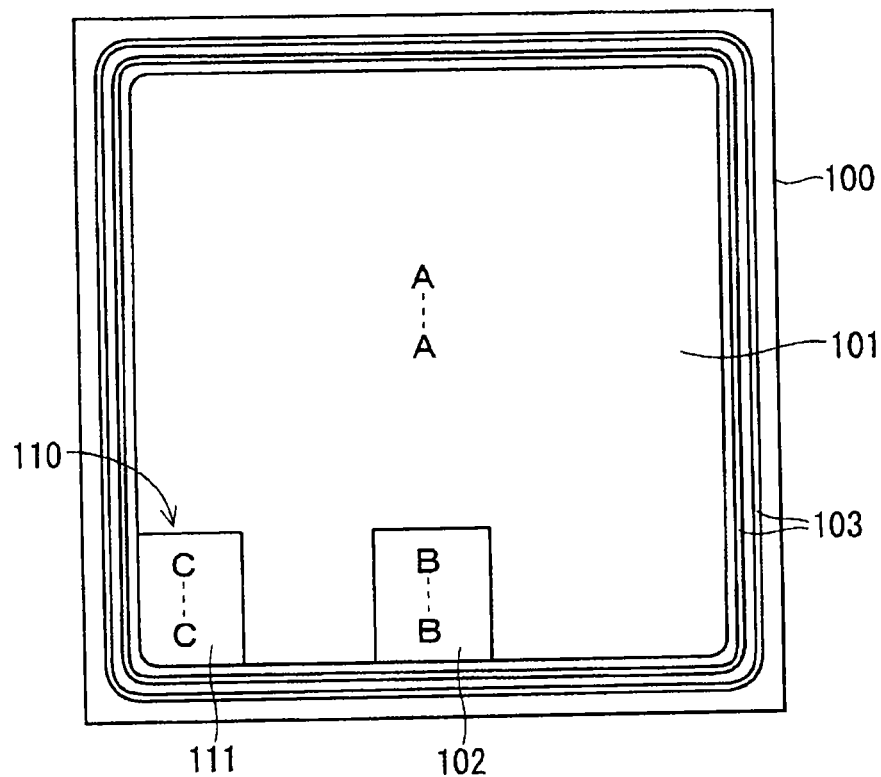
FIG. 6 is a top view of a semiconductor chip with a semiconductor device of a second preferred embodiment.

FIG. 6 is a top view of a MOSFET chip 100 of a second preferred embodiment. Some of MOSFET cells of the MOSFET chip 100 is used as a current sensing cell 110. A source electrode (current sensing electrode) 111 of the current sensing cell 110 is separated from a source electrode 101 of a main MOSFET cell, whereas the gate electrode of the current sensing cell 110 is shared with the main MOSFET cell and is connected to a gate pad 102.

Figure 7:
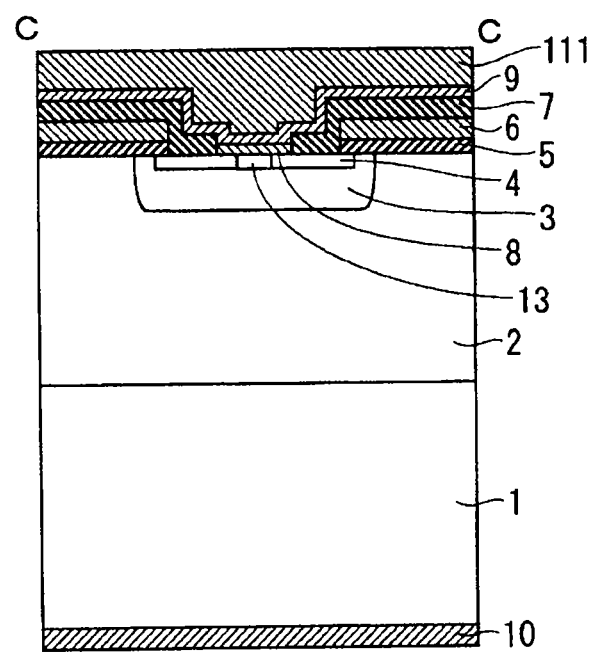
FIG. 7 is a sectional view of a current sensing cell portion of the semiconductor device of the second preferred embodiment.

FIG. 7 is a sectional view of the current sensing cell 110 of the MOSFET chip 110 (cross section taken along a line C-C of FIG. 6). A cross section of the main MOSFET cell (cross section taken along a line A-A of FIG. 6) is the same as that shown in FIG. 2A, and a cross section of a gate pad portion (cross section taken along a line B-B of FIG. 6) is the same as that shown in FIG. 2B. Constituents shown in FIGS. 6 and 7 corresponding to those shown in FIGS. 1 and 2 are designated by the same reference numerals, and are not described in detail below.

As shown in FIG. 7, the current sensing cell 110 has the same structure as that of the main MOSFET cell (FIG. 2A). To be specific, a barrier metal layer 9 is interposed between an interlayer insulating film 7 and the source electrode (current sensing electrode) 111. So, like the main MOSFET cell, the current sensing cell 110 prevents generation of corrosion of the interlayer insulating film 7 and reduction in a threshold voltage (VGSth) as described in the first preferred embodiment.

Current cannot be detected precisely so protection from overcurrent cannot be achieved well if the main MOSFET cell and the current sensing cell 110 have different threshold voltages. Meanwhile, in the second preferred embodiment, the current sensing cell 110 and the main MOSFET cell both have the barrier metal layer 9, so that the current sensing cell 110 and the main MOSFET cell are allowed to have the same threshold voltage, thereby achieving precise current detection. As a matter of course, the thickness of the barrier metal layer 9 is preferably the same in the main MOSFET cell and the current sensing cell 110.

Like in the first preferred embodiment, in the second preferred embodiment, the barrier metal layer 9 preferably has a thickness of 60 nm or more in a case where it is made of Ti, and preferably has a thickness of 90 nm or more in a case where it is made of TiN.

Third Preferred Embodiment

It has been derived from the first preferred embodiment that the thickness of the barrier metal layer 9 of 60 nm or more can limit reduction of a threshold voltage to be about 0.2 V or less from the results (FIG. 4) of the HTGB test conducted in the cases where the barrier metal layer 9 had a thickness of 30 nm and 75 nm.

However, the inventors have conducted further experiments and found that the effect of suppressing reduction of a threshold voltage has already become saturated in the state in which the thickness of the Ti barrier metal layer 9 is smaller than 75 nm and reduction of a threshold voltage can be suppressed sufficiently even in a case where the thickness of the barrier metal layer 9 is smaller than 60 nm. The experimental results thereof are described below.

Figure 8:
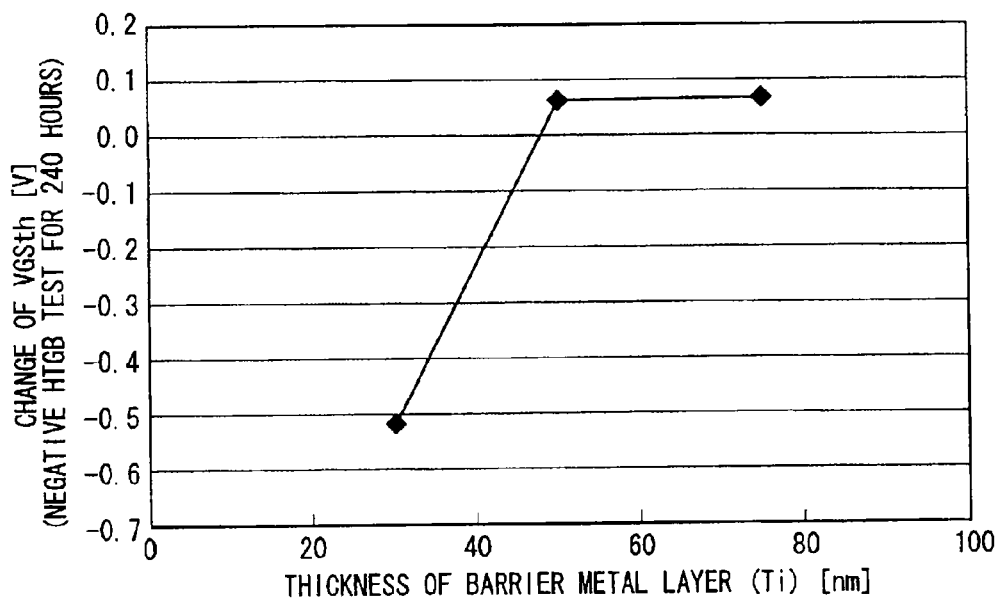
FIG. 8 shows a relationship between the thickness of a Ti barrier metal layer and the change of the threshold voltage of the MOSFET.

FIG. 8 shows a relationship between the thickness of the Ti barrier metal layer 9 and the change of the threshold voltage (VGSth) of the MOSFET. Here, the HTGB test similar to that of FIG. 3 was conducted for 240 hours on a MOSFET with the barrier metal layer 9 having a thickness of 30 nm, a MOSFET with the barrier metal layer 9 having a thickness of 50 nm and a MOSFET with the barrier metal layer 9 having a thickness of 75 nm.

The threshold voltage did not reduce after the HTGB test conducted for 240 hours when the Ti barrier metal layer 9 had a thickness of 50 nm. In contrast, as also shown in FIG. 4, the threshold voltage reduced by about 0.5 V when the barrier metal layer 9 had a thickness of 30 nm. The results above reveal that the thickness of the barrier metal layer 9 of 40 nm or more is especially effective as it can limit reduction of a threshold voltage to about 0.2 V or less.

Further, also in the second preferred embodiment, the thickness of the barrier metal layer 9 is preferably 40 nm or more when the barrier metal layer 9 is made of Ti.

Fourth Preferred Embodiment

While the barrier metal layer 9 that prevents diffusion of Al is Ti or TiN in the first to third preferred embodiments, similar effects can be achieved as well when TiSi is used.

Figure 9:
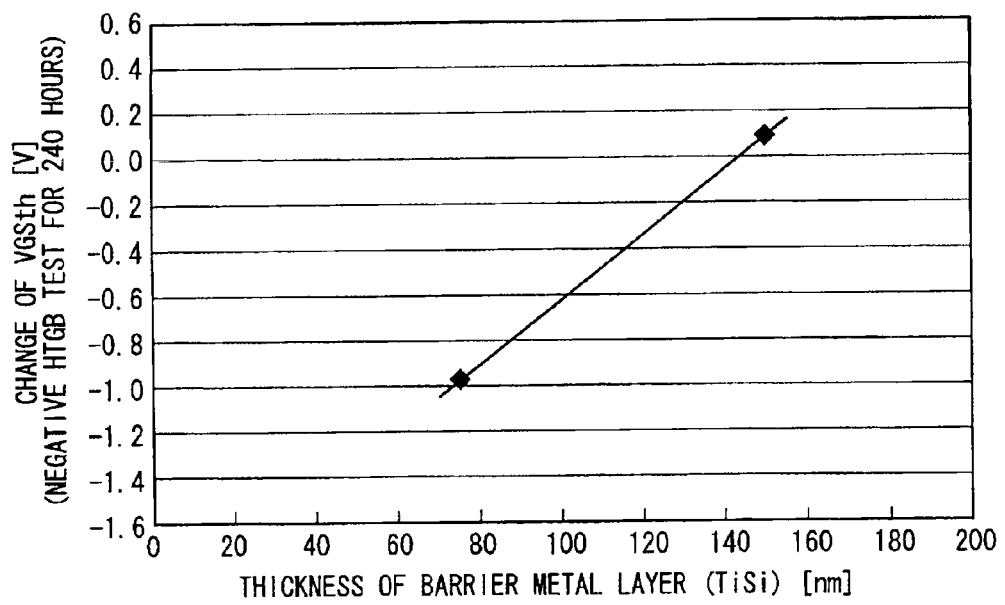
FIG. 9 shows a relationship between the thickness of a TiSi barrier metal layer and the change of the threshold voltage of the MOSFET.

FIG. 9 shows a relationship between the thickness of a TiSi barrier metal layer 9 and the change of the threshold voltage (VGSth) of the MOSFET. TiSi can be formed by depositing Ti to have a desired thickness and then performing lamp annealing at 800° for about 30 seconds under an argon (Ar) atmosphere. The method of forming TiSi used in the embodiments below may be similar to the above as well. For example, in a case of forming TiSi having a thickness of 75 nm, Ti is deposited to have a thickness of 75 nm and then is subjected to lamp annealing as described above. Here, the HTGB test similar to that of FIG. 3 was conducted for 240 hours on a MOSFET with the barrier metal layer 9 having a thickness of 75 nm and a MOSFET with the barrier metal layer 9 having a thickness of 150 nm.

As shown in FIG. 9, the threshold voltage did not reduce after the HTGB test conducted for 240 hours when the TiSi barrier metal layer 9 had a thickness of 150 nm, but the threshold voltage reduced by about 1.0 V when the TiSi barrier metal layer 9 had a thickness of 75 nm. In the case where the barrier metal layer 9 is made of TiSi, the thickness of the barrier metal layer 9 of 130 nm or more is effective as it can limit reduction of the threshold voltage to about 0.2 V or less.

The above shows that in the case where the TiSi barrier metal layer 9 is used, a reduction of the threshold voltage can be sufficiently suppressed when the thickness thereof is 130 nm or more, so that the operation of the MOSFET is given enhanced stability.

Also in the case where the barrier metal layer 9 is made of TiSi, as in the first preferred embodiment, it is possible to prevent corrosion of the interlayer insulating film 7 by Al contained in the source electrode 101 and the generation of Al spike in the polysilicon gate electrode 6, thereby preventing a short circuit between the gate and the source. Al spike in the gate electrode 6 in the gate pad portion caused by Al contained in the gate pad 102 is also prevented.

The TiSi barrier metal layer 9 is also applicable to the second preferred embodiment. That is, TiSi may be used for the main MOSFET cell and the barrier metal layer 9 of the current sensing cell 110. This allows the main MOSFET cell and the current sensing cell 110 to have the same threshold voltage, thereby achieving precise current detection. Also in that case, the thickness of the barrier metal layer 9 is preferably 130 nm or more.

Fifth Preferred Embodiment

A fifth preferred embodiment shows an example in which the barrier metal layer 9 has a two-layer structure formed of a TiSi layer and a Ti layer.

Figure 10A:
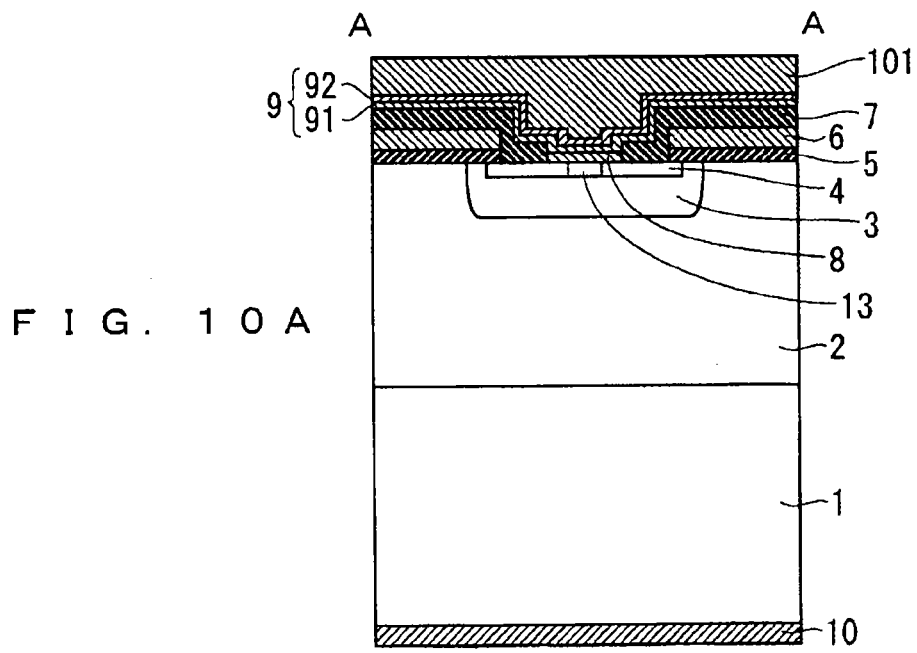
FIGS. 10A and 10B respectively are sectional views of a MOSFET cell portion and a gate pad region of a semiconductor chip of a fifth preferred embodiment.
Figure 10B:
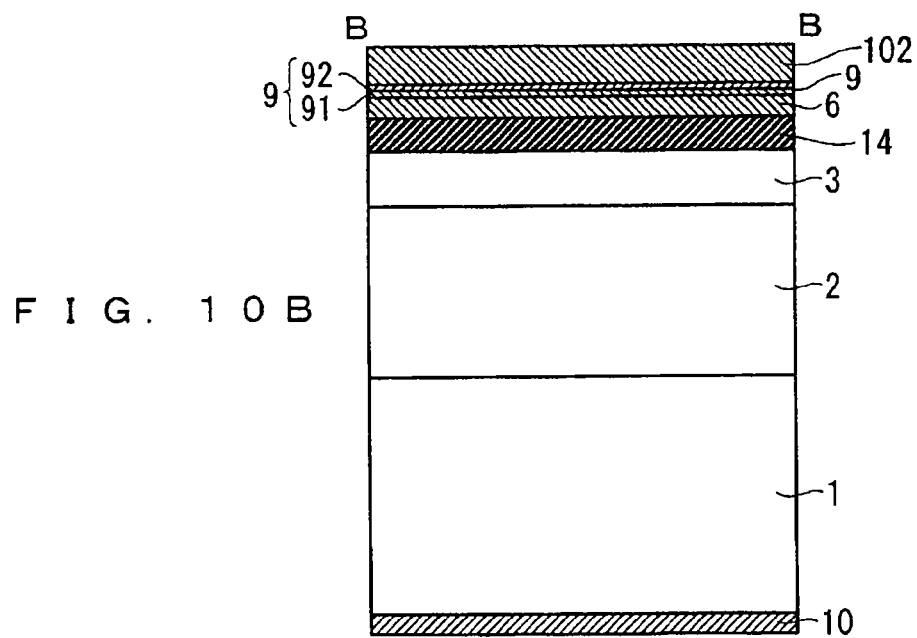

FIGS. 10A and 10B are sectional views of a MOSFET chip 100 of the fifth preferred embodiment, where FIG. 10A shows the cross section of a MOSFET cell portion (cross section taken along the line A-A of FIG. 1) and FIG. 10B shows a cross section of a sectional MOSFET cell portion of a gate pad portion (cross section taken along the line B-B of FIG. 1).

As shown in FIGS. 10A and 10B, in the MOSFET chip 100 of this preferred embodiment, the barrier metal layer 9 has a two-layer structure formed of a TiSi layer 91 being a lower layer and a Ti layer 92 being an upper layer. The other configuration is similar to that of the first preferred embodiment, which is not described below.

FIG. 11 is a graph showing a relationship between time of a negative HTGB test on a MOSFET and the change (change from its initial threshold voltage) of a threshold voltage (VGSth) between the gate and the source of a MOSFET. This graph shows the case of a conventional structure that does not include the barrier metal layer 9 and the case in which the barrier metal layer 9 having a two-layer structure 9 formed of the TiSi layer 91 and the Ti layer 92 is provided. Here, the thicknesses of the TiSi layer 91 and the Ti layer 92 were respectively 75 nm (the thickness of the barrier metal layer 9 was 150 nm). As in FIG. 3, the HTGB test was conducted with a gate-to-source voltage set at −20 V, and with an ambient temperature set at 125° C.

As shown in FIG. 11, the MOSFET with the barrier metal layer 9 having a two-layer structure formed of the TiSi layer 91 and the Ti layer 92 experienced little reduction in a threshold voltage after the HTGB test conducted for 240 hours. As understood from the comparison with FIG. 3, the effects thereof are similar to those of the Ti barrier metal layer 9 having a thickness of 75 nm. Meanwhile, the conventional MOSFET experienced reduction in the threshold voltage of about 5 V from its initial value, as also shown in FIG. 3.

As described above, it is possible to suppress reduction of the threshold voltage of the MOSFET even in a case where the barrier metal layer 9 has a two-layer structure formed of the TiSi layer 91 and the Ti layer 92. Accordingly, the operation of the MOSFET is given enhanced stability.

Also in the case where the barrier metal layer 9 has a two-layer structure formed of the TiSi layer 91 and the Ti layer 92, as in the first preferred embodiment, it is possible to prevent corrosion of the interlayer insulating film 7 by Al contained in the source electrode 101 and the generation of Al spike in the polysilicon gate electrode 6, thereby preventing a short circuit between the gate and the source. Al spike in the gate electrode 6 in the gate pad portion to caused by Al contained in the gate pad 102 is also prevented.

The barrier metal layer 9 having a two-layer structure formed of the TiSi layer 91 and the Ti layer 92 is also applicable to the second preferred embodiment. That is, the barrier metal layer 9 of the main MOSFET cell and the current sensing cell 110 may have a two-layer structure. This allows the main MOSFET cell and the current sensing cell 110 to have the same threshold voltage, thereby achieving precise current detection.

Sixth Preferred Embodiment

A sixth preferred embodiment shows an example in which the barrier metal layer 9 has a two-layer structure formed of a TiN layer and a Ti layer.

Figure 12A:
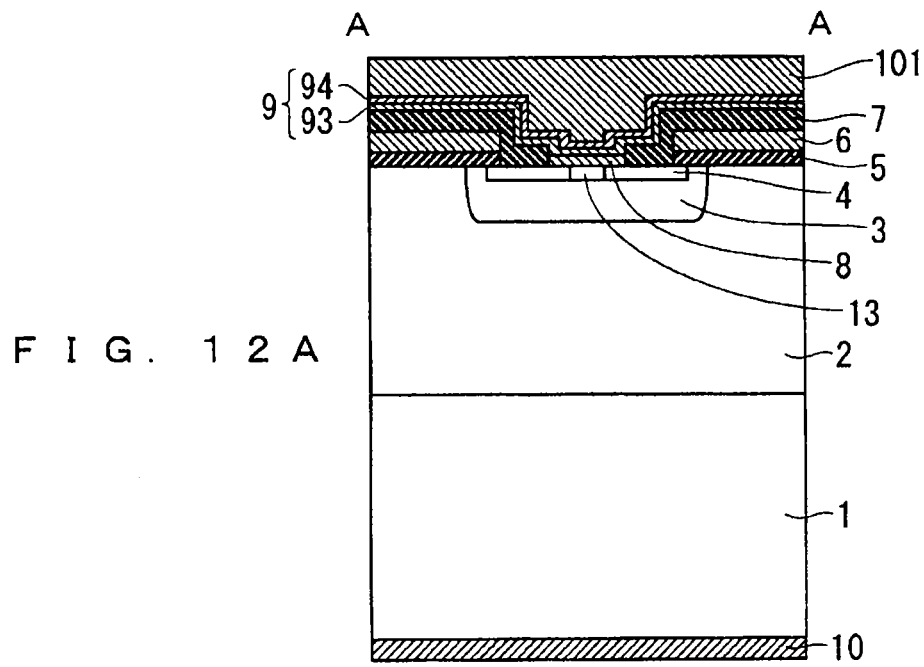
FIGS. 12A and 12B are cross-sectional views of a MOSFET cell portion and a gate pad region of a semiconductor chip of a sixth preferred embodiment.
Figure 12B:
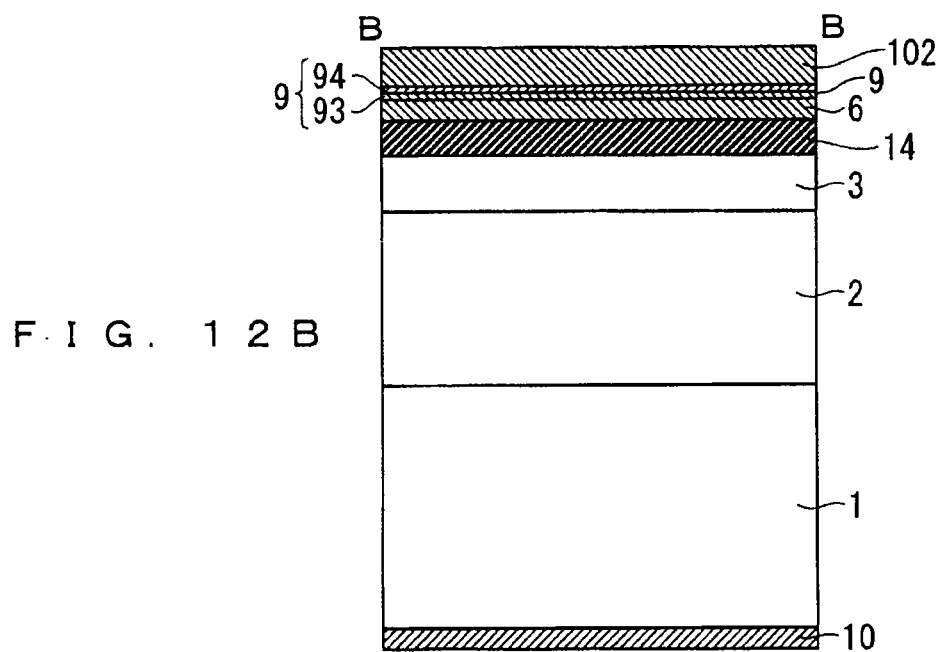

FIGS. 12A and 12B are sectional views of a MOSFET chip 100 of the sixth preferred embodiment, where FIG. 12A shows the cross section of a MOSFET cell portion (cross section taken along the line A-A of FIG. 1) and FIG. 12B shows a cross section of a sectional MOSFET cell portion of a gate pad portion (cross section taken along the line B-B of FIG. 1).

As shown in FIGS. 12A and 12B, in the MOSFET chip 100 of this preferred embodiment, the barrier metal layer 9 has a two-layer structure formed of a TiN layer 93 being a lower layer and a Ti layer 94 being an upper layer. The other configuration is similar to that of the first preferred embodiment, which is not described below.

Figure 13:
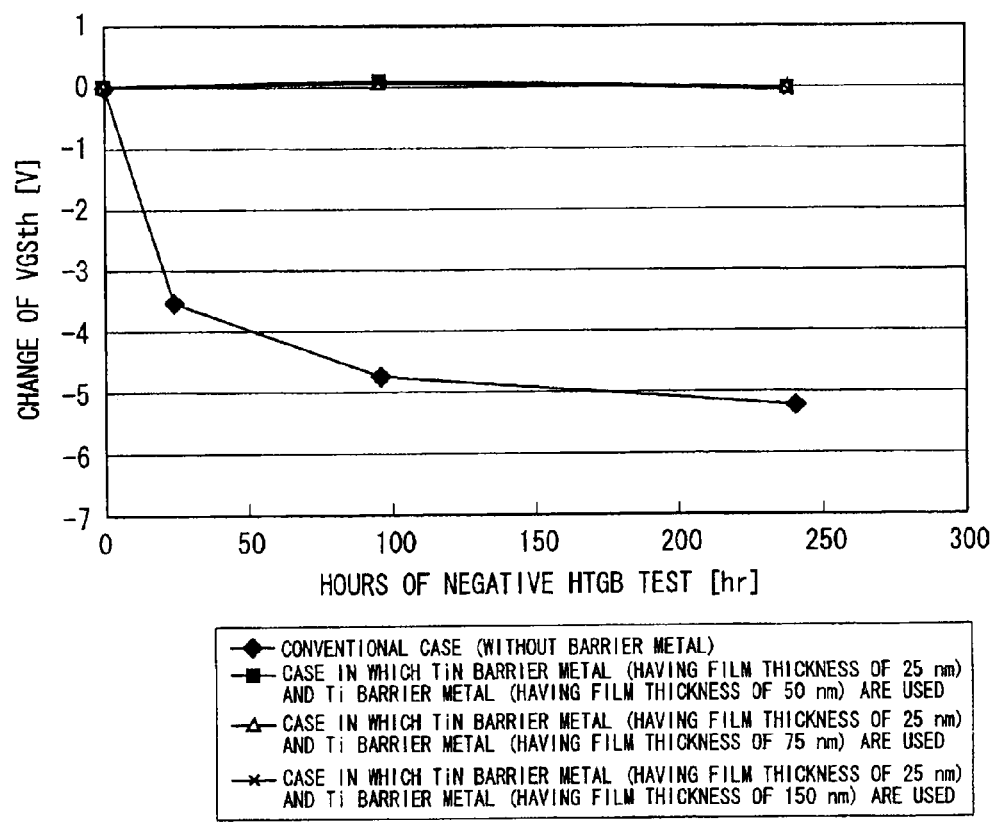
FIG. 13 shows a relationship between time of a negative HTGB test and the change of a threshold voltage of a MOSFET.

FIG. 13 is a graph showing a relationship between time of a negative HTGB test on a MOSFET and the change (change from its initial threshold voltage) of a threshold voltage (VGSth) between the gate and the source of a MOSFET. This graph shows the case of a conventional structure that does not include the barrier metal layer 9 and the case in which the barrier metal layer 9 having a two-layer structure 9 formed of the TiN layer 93 and the Ti layer 94 is provided. Here, the results of the HTGB tests are shown in the case where the TiN layer 93 and the Ti layer 94 each had a thickness of 75 nm (the thickness of the barrier metal layer 9 was 150 nm), the case where the TiN layer 93 had a thickness of 25 nm and the Ti layer 94 had a thickness of 75 nm (the thickness of the barrier metal layer 9 was 100 nm), and the case where the TiN layer 93 had a thickness of 25 nm and the Ti layer 94 had a thickness of 150 nm (the thickness of the barrier metal layer 9 was 175 nm). As in FIG. 3, each of the HTGB tests was conducted with a gate-to-source voltage set at −20 V, and with an ambient temperature set at 125° C.

As shown in FIG. 13, the MOSFET with the barrier metal layer 9 having a two-layer structure formed of the TiN layer 93 and the Ti layer 94 experienced little reduction in a threshold voltage after the HTGB test conducted for 240 hours in all of the above-mentioned three cases. As understood from the comparison with FIG. 3, the effects thereof are similar to those of the Ti barrier metal layer 9 having a thickness of 75 nm. Meanwhile, the conventional MOSFET experienced reduction in the threshold voltage of about 5 V from its initial value, as also shown in FIG. 3.

As described above, it is possible to suppress reduction of the threshold voltage of the MOSFET even in a case where the barrier metal layer 9 has a two-layer structure formed of the TiN layer 93 and the Ti layer 94. Accordingly, the operation of the MOSFET is given enhanced stability.

Also in the case where the barrier metal layer 9 has a two-layer structure formed of the TiN layer 93 and the Ti layer 94, as in the first preferred embodiment, it is possible to prevent corrosion of the interlayer insulating film 7 by Al contained in the source electrode 101 and the generation of Al spike in the polysilicon gate electrode 6, thereby preventing a short circuit between the gate and the source. Al spike in the gate electrode 6 in the gate pad portion to caused by Al contained in the gate pad 102 is also prevented.

The barrier metal layer 9 having a two-layer structure formed of the TiN layer 93 and the Ti layer 94 is also applicable to the second preferred embodiment. That is, the barrier metal layer 9 of the main MOSFET cell and the current sensing cell 110 may have a two-layer structure. This allows the main MOSFET cell and the current sensing cell 110 to have the same threshold voltage, thereby achieving precise current detection.

Seventh Preferred Embodiment

Figure 14:
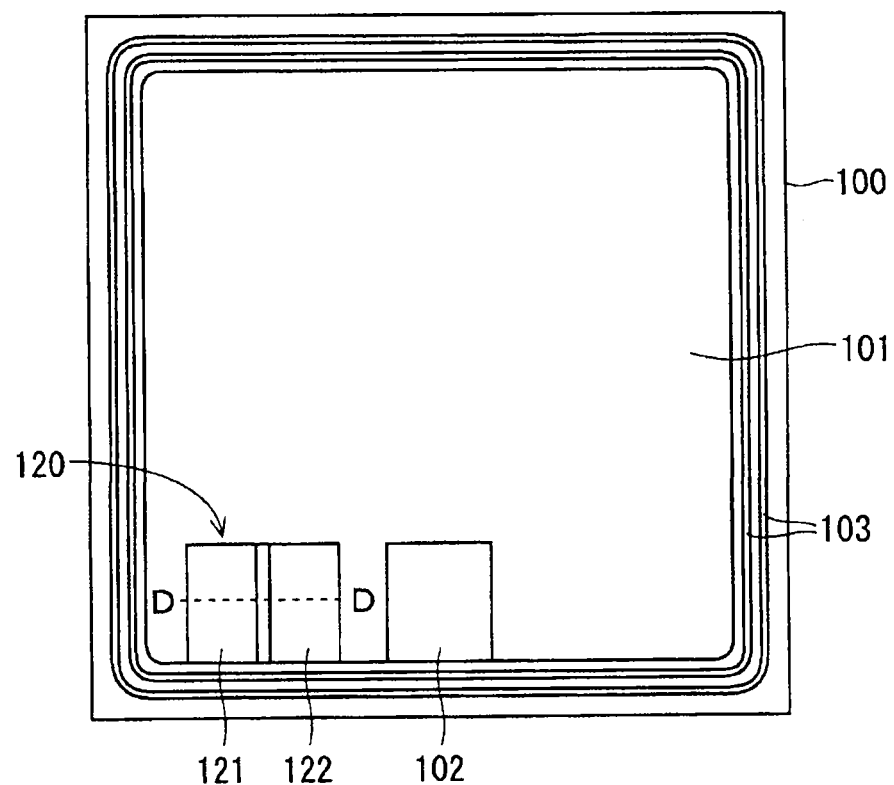
FIG. 14 is a top view of a semiconductor chip with a semiconductor device of a seventh preferred embodiment.

FIG. 14 is a top view of a MOSFET chip 100 of a seventh preferred embodiment. The MOSFET chip 100 includes a temperature sensing diode 120 as a temperature sensor that detects the chip temperature. The MOSFET cell portion and the gate pad portion of the MOSFET chip 100 have similar structures to those of the first preferred embodiment (FIG. 2), which are not described below. Alternatively, the MOSFET chip 100 may further include the current sensing cell 110 of the second preferred embodiment.

Figure 15:
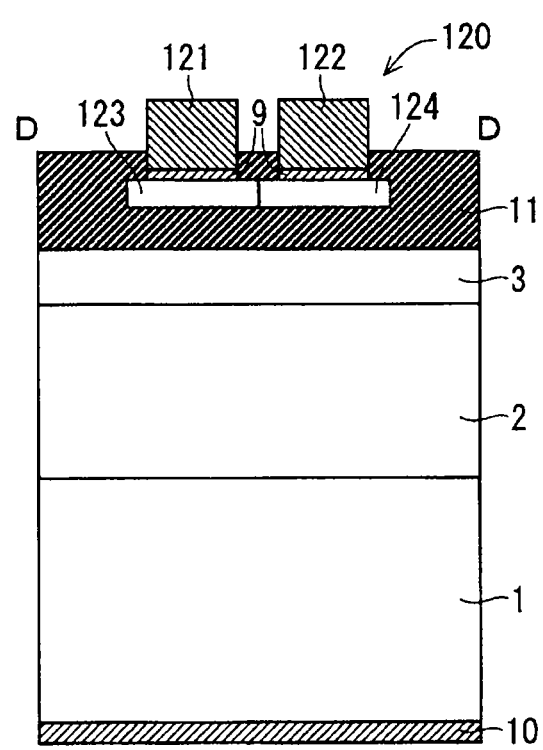
FIG. 15 is a sectional view of a temperature sensing diode portion of the semiconductor device of the sixth preferred embodiment.

FIG. 15 is a sectional view (sectional view taken along a line D-D of FIG. 14) of the temperature sensing diode 120 of the MOSFET chip 100. As shown in FIG. 15, the temperature sensing diode 120 is formed of a p-type polysilicon 123 and an n-type polysilicon 124 adjacent thereto and is disposed on a silicon oxide film 11 formed on an epitaxial growth layer serving as the n⁻-drift layer 2 of the MOSFET. An anode electrode 121 is disposed on the p-type polysilicon 123 via the barrier metal layer 9, and the cathode electrode 122 is disposed on the n-type polysilicon 124 via the barrier metal layer 9.

The barrier metal layer 9 of the temperature sensing diode 120 is formed in the same process for the barrier metal layer 9 disposed below the source electrode 101 and the gate pad 102 of the MOSFET and is made of titanium (Ti) or titanium nitride (TiN). The anode electrode 121 and the cathode electrode 122 are formed in the same process for the source electrode 101 and the gate pad 102 of the MOSFET and is formed of Al or an Al alloy (for example, AlSi).

As described above, the barrier metal layer 9 is disposed in the contact part between the p-type polysilicon 123 and the anode electrode 121 and the contact part between the n-type polysilicon 124 and the cathode electrode 122 in the temperature sensing diode 120, which improves electrical contact in those contact parts. As a result, temperature characteristics of the temperature sensing diode 120 become stabilized, and the temperature of the MOSFET chip 100 is detected with accuracy, which contributes to the stabilization of the operation of a MOSFET.

Further, as in this preferred embodiment, one same as the barrier metal layer 9 disposed below the source electrode 101 and the gate pad 102 of the MOSFET is used as the barrier metal layer 9 provided below the anode electrode 121 and the cathode electrode 122 of the temperature sensing diode 120, leading to an effect that a rise of a manufacturing cost is prevented.

While the barrier metal layer 9 is made of Ti or TiN as in the first preferred embodiment in the description above, it may be made of TiSi as in the fourth preferred embodiment, may have a two-layer structure formed of a TiSi layer and a Ti layer as in the fifth preferred embodiment, or may have a two-layer structure formed of a TiN layer and a Ti layer as in the sixth preferred embodiment.

In particular, in the case where the barrier metal layer 9 made of TiSi or TiN, the barrier metal layer 9 having a two-layer structure formed of a TiSi layer and a Ti layer, or the barrier metal layer 9 having a two-layer structure formed of a TiN layer and a Ti layer is disposed on the p-type polysilicon 123 and the n-type polysilicon 124, electrical contact between the p-type polysilicon 123 and the anode electrode 121 and electrical contact between the n-type polysilicon 124 and the cathode electrode 122 are enhanced further, whereby the temperature of the MOSFET chip 100 can be detected with more accuracy.

While the MOSFET having a structure in which the drift layer 2 and the buffer layer 1 (substrate) have the same conductivity type has been described above, the present invention is also applicable to an IGBT having a structure in which the drift layer 2 and the substrate 1 have different conductivity types. For example, the configuration of an IGBT is achieved when the buffer layer 1 is changed to p-type one in the configuration shown in FIG. 2A. In that case, the source region 4 and the source electrode 101 of the MOSFET correspond to the emitter region and the emitter electrode of the IGBT, respectively, and the drain electrode 10 of the MOSFET corresponds to the collector electrode.

The semiconductor devices described in the respective preferred embodiments are formed by using SiC that is a wide-bandgap semiconductor having high resistance to heat. Semiconductor devices using different wide-bandgap semiconductors are also used effectively for application of the present invention as they have relatively high resistance to heat. Examples of the different wide-gap semiconductors include gallium nitride (GaN) based materials and diamond.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a main transistor cell with a gate insulating film formed on a silicon carbide semiconductor layer, a gate electrode formed on said gate insulating film, and a source region that is an impurity region formed in an upper portion of said semiconductor layer;
an interlayer insulating film covering said gate electrode;
a source electrode connected to said source region while extending on said interlayer insulating film;
a gate pad connected to said gate electrode;
a barrier metal layer including Ti and disposed under said source electrode and under said gate pad;
a temperature sensing diode formed on said semiconductor layer and including a p-type polysilicon and an n-type polysilicon;
an anode electrode connected to said p-type polysilicon; and
a cathode electrode connected to said n-type polysilicon,
wherein said barrier metal layer is also interposed between said p-type polysilicon and said anode electrode as well as between said n-type polysilicon and said cathode electrode.

2. The semiconductor device according to claim 1, wherein said barrier metal layer is any one of a TiSi layer, TiN layer, a two-layer structure including a TiSi layer and a Ti layer, and a two-layer structure including a TiN layer and a Ti layer.

3. The semiconductor device according to claim 1, wherein:
said barrier metal layer extends continuously from the top portion of said interlayer insulating film to a side portion of said interlayer insulating film.

4. The semiconductor device according to claim 1, wherein:
said barrier metal layer has been patterned together with said source electrode and said gate pad.

5. The semiconductor device according to claim 1, further comprising:
a silicide layer in direct ohmic contact with said source region, said silicide layer disposed between said source region and said source electrode; wherein
said barrier metal layer is further disposed between said silicide layer and said source electrode.

6. A semiconductor device, comprising:
a main transistor cell with a gate insulating film formed on a silicon carbide semiconductor layer, a gate electrode formed on said gate insulating film, and a source region that is an impurity region formed in an upper portion of said semiconductor layer;
an interlayer insulating film covering said gate electrode;
a source electrode connected to said source region while extending on said interlayer insulating film;
a gate pad connected to said gate electrode; and
a barrier metal layer disposed under said source electrode and said gate pad, said barrier metal layer extending continuously from a top portion of said interlayer insulating film to a side portion of said interlayer insulating film,
wherein said barrier metal layer includes Ti.

7. The semiconductor device according to claim 6, wherein said barrier metal layer is a Ti layer having a thickness of 40 nm or more.

8. The semiconductor device according to claim 6, wherein said barrier metal layer is a TiSi layer having a thickness of 130 nm or more.

9. The semiconductor device according to claim 6, wherein said barrier metal layer has a two-layer structure including a TiSi layer and a Ti layer.

10. The semiconductor device according to claim 6, wherein said barrier metal layer has a two-layer structure including a TiN layer and a Ti layer.

11. The semiconductor device according to claim 6, wherein:
said barrier metal layer extends continuously from the top portion of said inter layer insulating film to a side portion of said interlayer insulating film.

12. The semiconductor device according to claim 6, wherein:
said barrier metal layer has been patterned together with said source electrode and said gate pad.

13. The semiconductor device according to claim 6, wherein:
a thickness of the barrier metal layer is defined to reduce a reduction in a threshold voltage less than 2 V during an HTGB test conducted for 240 hours by applying a negative voltage to the gate of the MOSFET, the HTGB test conducted with a gate-to-source voltage set at −20 V and with an ambient temperature set at 125° C.

14. A semiconductor device, comprising:
a main transistor cell with a gate insulating film formed on a silicon carbide semiconductor layer, a gate electrode formed on said gate insulating film, and a source region that is an impurity region formed in an upper portion of said semiconductor layer;
an interlayer insulating film covering said gate electrode;
a source electrode connected to said source region while extending on said interlayer insulating film;
a gate pad connected to said gate electrode; and
a barrier metal layer disposed under said source electrode and said gate pad, said barrier metal layer extending continuously from a top portion of said interlayer insulating film to a side portion of said interlayer insulating film,
wherein said barrier metal layer includes Ti,
wherein the semiconductor device further comprises:
a silicide layer in direct ohmic contact with said source region, said silicide layer disposed between said source region and said source electrode,
wherein said barrier metal layer is further disposed between said silicide layer and said source electrode.

* * * * *